(12) United States Patent
Lambert et al.

(10) Patent No.: US 7,643,968 B1
(45) Date of Patent: Jan. 5, 2010

(54) METHOD AND APPARATUS FOR SIMPLIFIED PATTERNING OF FEATURES IN A COMPUTER AIDED DESIGN (CAD) MODEL

(75) Inventors: Mark W. Lambert, Lake Oswego, OR (US); Paul R. Lebovitz, Portland, OR (US)

(73) Assignee: Autodesk, Inc., San Rafael, CA (US)

( * ) Notice: Subject to any disclaimer, the term of this patent is extended or adjusted under 35 U.S.C. 154(b) by 644 days.

(21) Appl. No.: 10/085,528

(22) Filed: Feb. 25, 2002

(51) Int. Cl.
*G06F 7/60* (2006.01)
*G09G 5/00* (2006.01)

(52) U.S. Cl. .......................... 703/2; 345/652
(58) Field of Classification Search ................ 703/2, 703/6, 7, 3; 345/652–654
See application file for complete search history.

(56) References Cited

U.S. PATENT DOCUMENTS

| | | | |
|---|---|---|---|
| 4,736,306 A * | 4/1988 | Christensen et al. ........ 345/420 |
| 5,255,352 A * | 10/1993 | Falk ........................... 345/582 |
| 5,357,439 A | 10/1994 | Matsuzaki et al. |
| 5,402,349 A | 3/1995 | Fujita et al. |
| 5,495,430 A | 2/1996 | Matsunari et al. |
| 5,767,848 A | 6/1998 | Matsuzaki et al. |
| 6,021,358 A | 2/2000 | Sachs |
| 6,124,861 A * | 9/2000 | Lebovitz et al. ............. 715/808 |
| 6,128,020 A * | 10/2000 | Arimatsu et al. ............ 345/420 |
| 6,223,092 B1 | 4/2001 | Miyakawa et al. |
| 6,230,066 B1 | 5/2001 | Sferro et al. |
| 6,337,685 B2 * | 1/2002 | Nagakura .................... 345/419 |
| 6,343,285 B1 | 1/2002 | Tanaka et al. |
| 6,384,841 B1 * | 5/2002 | Lebovitz et al. ............. 345/642 |
| 6,526,550 B1 * | 2/2003 | Badding et al. ................ 716/5 |
| 6,542,937 B1 * | 4/2003 | Kask et al. ................... 719/328 |
| 6,614,430 B1 | 9/2003 | Rappoport |
| 6,810,295 B1 * | 10/2004 | Hochenauer et al. .......... 700/98 |
| 6,859,768 B1 | 2/2005 | Wakelam et al. |
| 6,895,371 B1 * | 5/2005 | Ames et al. .................... 703/1 |
| 6,925,344 B1 * | 8/2005 | Lambert et al. ............... 700/98 |

(Continued)

OTHER PUBLICATIONS

Zarrillo, Andrew. "Autodesk Licenses Constraint Management Technology." Business Wire. New York. Feb 26, 1990. Sec.1, p. 1.*

(Continued)

*Primary Examiner*—Paul L Rodriguez
*Assistant Examiner*—Eunhee Kim
(74) *Attorney, Agent, or Firm*—Fish & Richardson P.C.

(57) ABSTRACT

The invention includes computer instructions that operate to receive an input corresponding to generation of a pattern in a computer aided design (CAD) solid model. Pattern is comprised of a number of features included within a boundary of the solid model. The instructions further operate to receive an indication of modification to the solid model. The instructions operate to automatically modify the solid model and its boundary based at least upon the received indication. The instructions further operate to automatically determine whether modification, if any, to at least one of pattern and number of features to be continuously included within the boundary of the modified solid model, is necessary, based at least upon the modified solid model and received input. Upon so determining, the instructions operate to cause the necessary modification to be effectuated. As a result, simplified modification of patterns of features in a CAD solid model is facilitated.

38 Claims, 10 Drawing Sheets

U.S. PATENT DOCUMENTS

2001/0047251 A1    11/2001    Kemp
2002/0042696 A1    4/2002    Garcia et al.

OTHER PUBLICATIONS

D-cubed, Ltd. Of Cambridge, England, corporate website—Feb.3, 2001 version, as stored in the "Internet Wayback Machine". http://web.archive.org/web/20010201070800/http://www.d-cubed.co.uk.*

Hoffmann, Christoph M. "D-Cubed's Dimensional Constraint Manager". Journal of Computing and Information Science in Engineering. Mar. 2001. vol. 1, Issue 1. pp. 100-101.*

Anonymous, "The Constraint Management Company". Computer-Aided Engineering. Aug. 1996. vol. 15, Issue 8, p. 26.*

Mills, Robert. "The Advanced State of Solid Modeling." Computer-Aided Engineering. Sep. 1998. vol. 17, Issue 9, pp. 56, 58, 60, 61, 64, 66.*

Anonymous, "Cool CAE Sites". Computer-Aided Engineering. Aug. 1996. vol. 15, Issue 8, p. 88.*

Beckert, Beverly A. "SolidWorks 98". Computer-Aided Engineering. May 1998. vol. 17, Issue 5, p. 28.*

Knoth, Janmarie, "Autofact '97: Making Manufacturing Accessible". Computer-Aided Engineering. Oct. 1997. vol. 16, Issue 10, pp. 36-37, 40, 94, 104, 106, 108, 110, and 115.*

Hoffman, C.M. And K.-J. Kim. "Towards Valid Parametric CAD Models." Computer-Aided Design. Jan. 2001. vol. 33, Issue 1, pp. 81-90.*

Durand, C. and C.M. Hoffmann. "Variational Constraints in 3D". Proc. Int'l Conf. on Shape Modeling and Applications, 1999. Mar. 1-4, 1999. pp. 90-97.*

Essert-Villard, C. and P. Mathis. "Interactive Handling of a Construction Plan in CAD." Proc. of the 5th Conf. on Information Visualization, 2001. Jul. 25-27, 2001. pp. 124-129.*

List of publications of Christoph M. Hoffmann. http://www.informatik.uni-trier.de/~ley/db/indicies/a-tree/h/Hoffmann:Christoph_M=.html.*

IEEE 100: The Authoritative Dictionary of IEEE Standards Terms, $7^{th}$ Ed. © Dec. 2000. p. 224.*

KeyCAD Complete for Windows™, © 1994. pp. 1-14, 9-6 to 9-8, A-11 to A-12to A-14, and I-3.*

The 2D DCM Manual Version 4.2, D-Cubed Ltd., Jan. 2002, Cambridge, England.

* cited by examiner

METHOD AND APPARATUS FOR SIMPLIFIED PATTERNING OF FEATURES IN A COMPUTER AIDED DESIGN (CAD) MODEL

FIELD OF INVENTION

The invention relates to the field of computer aided design (CAD). More specifically, the invention relates to simplified patterning of features in a three-dimensional solid geometry piece.

BACKGROUND OF THE INVENTION

Computer aided design (CAD) programs have allowed users to design various parts in "virtual" space before the parts ever reach a manufacturing stage. As CAD programs have become more powerful, parts modeled in "virtual" space (i.e., CAD models) have become more true to life. Often times, these CAD models are also referred to as three-dimensional (3-D) solid models or as solid models because of the fact that they are 3-D geometry pieces with solid properties, such as volume, faces that define the boundary of the three-dimensional solid geometry piece, weight, and so forth. Because the models have solid properties, solid features, such as solid featured forming patterns, may be incorporated into the solid models.

For example, a user may design a solid model of a speaker cover having small hole features arranged in a pattern to protect the delicate components while allowing sound to travel through the cover. Another example may be a solid model of a heatsink having fin features arranged in a particular pattern to increase the effective surface area for heat transfer. In both examples, the number of features forming the desired pattern may be numerous.

Often times, underlying these features are 2-D parametric sketches that geometrically define the features. For the example of small holes in the speaker covering, each of the small holes may be formed by a 2-D sketch of a small hole whereby the 2-D sketch of the small hole is extruded to perform a solid operation with the speaker covering. That is, the small hole is extruded and subtracted from the speaker covering forming the necessary holes. A change in the 2-D parametric sketch affects the solid model and vice versa.

Accordingly, during or subsequently, the user may change the design of the solid model, thereby affecting the surface on which the features may be patterned. In order to compensate for the change in the solid model, the user may be required to change the pattern of the features to ensure optimum utilization of the features. Furthermore, the user may change the design of the features themselves, thereby further affecting the pattern of the features.

Accommodating changes in design, in particular, the changes in design that affect the pattern of particular features may be difficult. For example, if the shape and/or size of the speaker cover is modified, the hole features that make up the pattern are required to be individually modified to ensure that the desired density of hole features is maintained within the boundary of the speaker cover. Modifying the hole features may involve individually modifying each 2-D sketch underlying the hole feature. Furthermore, the number of hole features may increase or decrease based at least upon the changes in shape and/or size of the speaker cover (i.e., the changes in the boundary of the patterned hole features). In the example of the heatsink, the pattern of the fin features may correspond to a desired effective surface area. Modifications in size and/or shape of the heatsink may affect the desired effective surface area because the boundary of the patterned fin features may change. However, in order to maintain the desired density of the fin features (i.e., the effective surface area), individual fin features may need to be modified in order to compensate for changes in the size and/or shape of the heatsink. Again, modifying individual fin features may involve modifying each 2-D sketch underlying each fin feature.

Parametric solid modeling capabilities of CAD programs may aid a user making necessary modifications to features and patterns in relation to design changes of a solid model. However, often times, correlating the features and the pattern with the solid model involves building numerous mathematical relationships between the features, in particular, the underlying 2-D sketches, the pattern, and the solid model. Building the numerous mathematical relationships may make designing features for a particular pattern very time consuming, and even minor errors in the mathematical relationships need to be corrected for the parametric solid modeling capabilities to function properly and provide the desired patterned results.

Often times, in order to reduce initial design time, a designer will forego building numerous mathematical relationships, and instead, proceed to design features and patterns without relationships on a solid model. However, if modifications of the solid model are desired, the designer may be required expend much more time to redesign the features, in particular, the underlying 2-D sketches, and patterns to accommodate the changes.

BRIEF DESCRIPTION OF DRAWINGS

The invention is illustrated by way of example and not by way of limitation in the figures of the accompanying drawings, in which the like references indicate similar elements and in which.

DETAILED DESCRIPTION OF THE INVENTION

Figure 1:
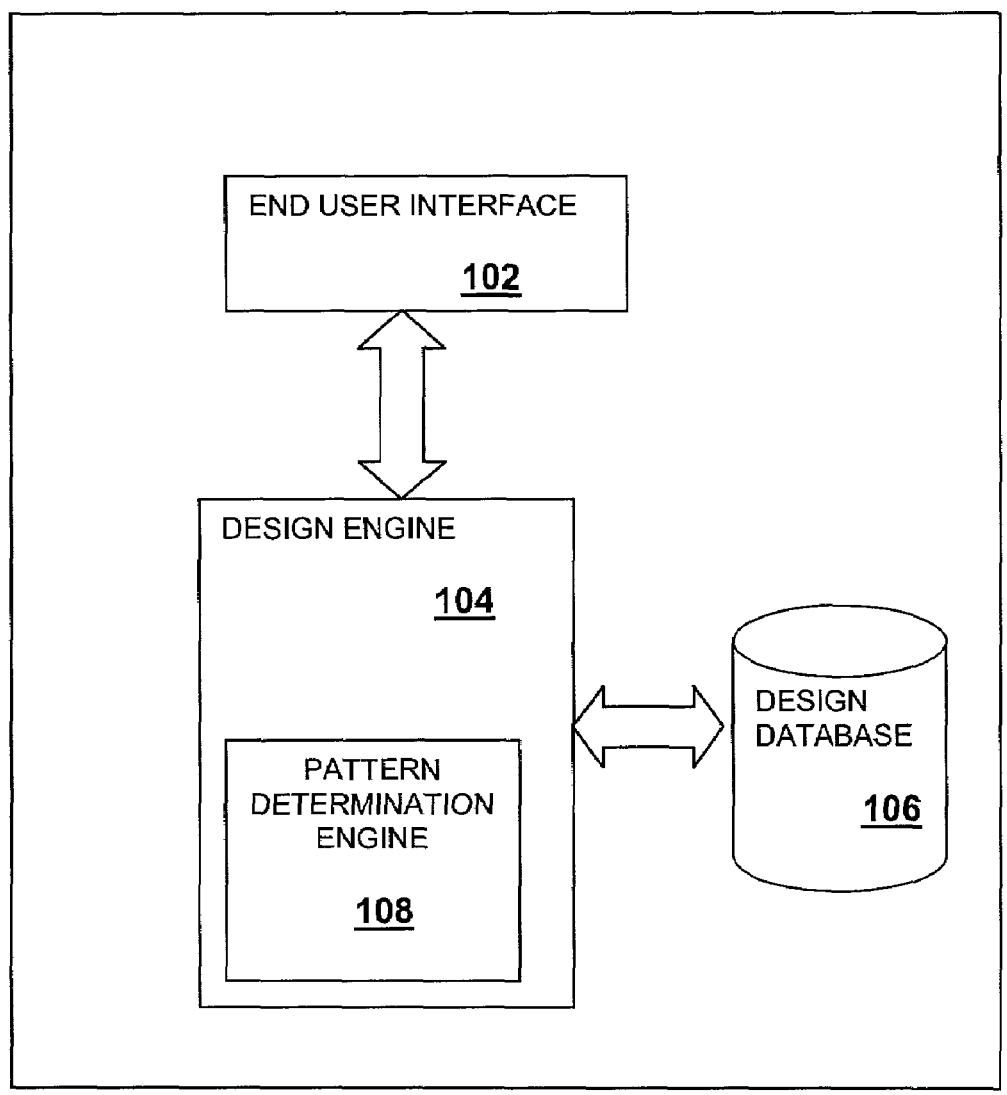
FIG. 1 illustrates a block diagram of one embodiment of a mechanical design application for facilitating simplified modification of patterns of features in a solid model, in accordance with the present invention.

In the following description, various aspects of the invention will be described. However, it will be apparent to those skilled in the art that the invention may be practiced with only some or all described aspects. For purposes of explanation, specific numbers, materials and configurations are set forth in order to provide a thorough understanding of the invention. However, it will also be apparent to one skilled in the art that the invention may be practiced without the specific details. In other instances, well-known features are omitted or simplified in order not to obscure the invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system, and the term computer system includes general purpose as well as special purpose data processing machines, systems, and the like, that are standalone, adjunct or embedded.

Various operations will be described as multiple discrete steps in turn, in a manner that is most helpful in understanding the invention. However, the order of description should not be construed as to imply that these operations are necessarily order dependent. In particular, these operations need not be performed in the order of presentation.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, or characteristics may be combined in any suitable manner in one or more embodiments.

For the purposes of describing the invention, 3-D computer aided design (CAD) models will be referred to as solid models. That is, the 3-D CAD models may have solid properties, such as, but not limited to, volume, weight, and density. Additionally, solid operations, such as subtract, unite, and the like, may be performed utilizing the 3-D CAD models. Furthermore, it should be appreciated that the 3-D CAD models may be of the parametric type, where various aspects of the 3-D CAD models may be updated utilizing underlying 2-D sketches, and so forth.

In various embodiments of the invention, simplified modification of patterns of features in a solid model is facilitated. This and other advantages will be evident from the disclosure.

FIG. 1 illustrates a block diagram of one embodiment of a mechanical design application for facilitating simplified modification of patterns of features in a solid model, in accordance with the present invention. In FIG. 1, mechanical design application 100 includes an end user interface 102, a design engine 104, and a design database 106. The design engine 104 includes, in particular, a pattern determination engine 108, in accordance with the invention. Together, the elements cooperate to modify patterns of features corresponding to modifications in the solid model, in accordance with one embodiment of the invention. The modification to the solid model may be in the form of modifications to underlying sketches of the solid model.

In FIG. 1, the end user interface 102 operates to graphically display and receive input, from a user, of a solid model under the control of the design engine 104. Under the control of the design engine 104, the design database 106 operates to store solid model information for modifying a pattern of features. In particular, the pattern determination engine 108 utilizes various inputs to automatically modify patterns of features in response to modifications of the solid model. Except for the teachings of the present invention incorporated in the pattern determination engine 108, the mechanical design application 100 is intended to represent a broad range of CAD software known in the art, including but not limited to Autodesk Inventor™, available from Autodesk, Inc. of San Rafael, Calif. Additionally, as alluded to earlier, the mechanical design application 100 may include parametric software components to provide parametric functionality, such as, but not limited to, 2D Dimensional Constraint Manager available from D-Cubed, Ltd. of Cambridge, England.

Figure 2:
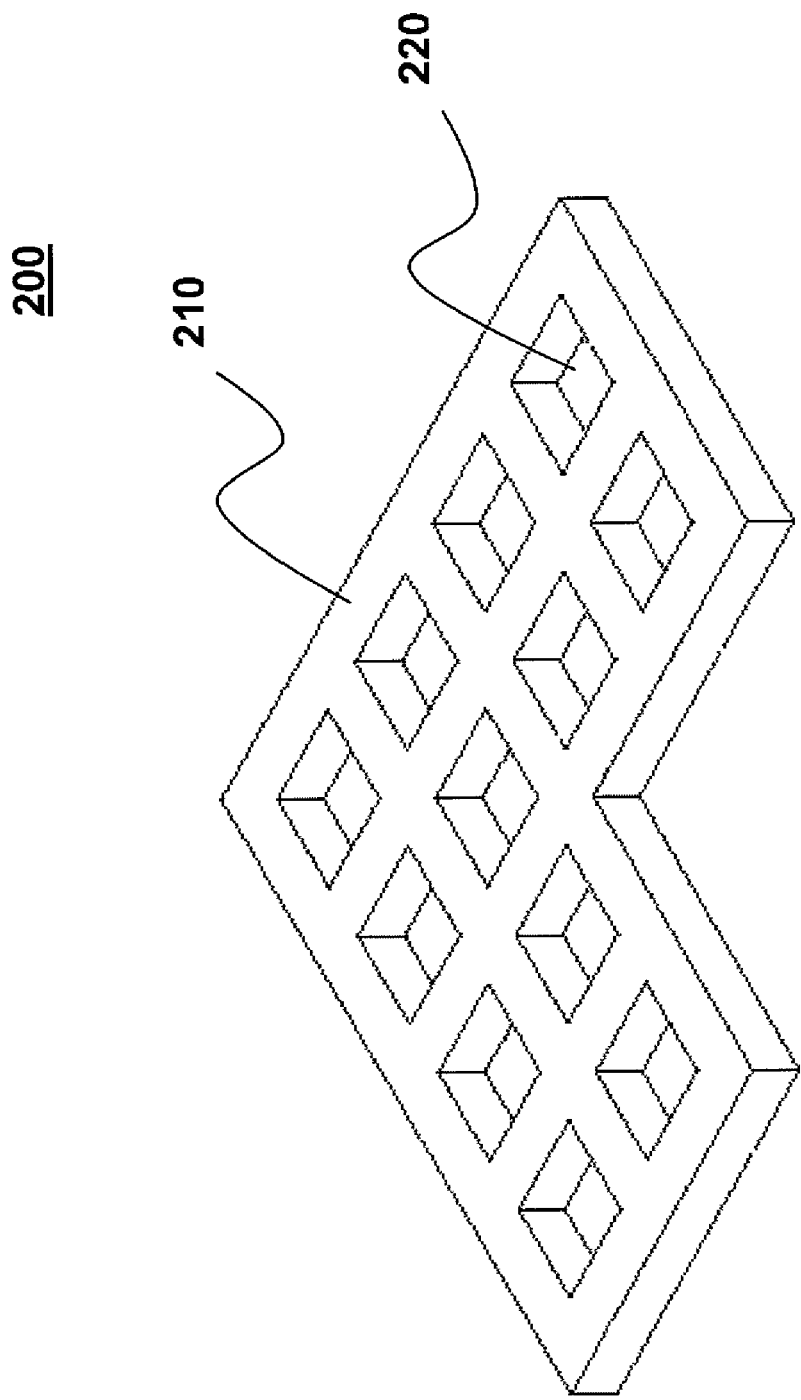
FIG. 2 illustrates an exemplary solid model having a pattern of features wherein the pattern may be automatically modified, in accordance with one embodiment of the invention.

FIG. 2 illustrates an exemplary solid model having a pattern of features wherein the pattern may be automatically modified, in accordance with one embodiment of the invention. Shown in FIG. 2 is a solid model 200 having a pattern 210 comprised of a number of features 220. The pattern 210 may be of a particular dimension and shape according to a design intent of a user (not shown). For example, the pattern 210 may be of a particular dimension and shape to facilitate passage of sound through each feature 220 of the solid model 200.

It should be appreciated that for the purposes of describing the invention, the solid model 200, the pattern 210, and the feature 220 that make up the pattern 210 may be parametrically related (i.e., modifications to underlying 2-D sketches, solid operations, and so forth will affect each other). Furthermore, since the pattern 210 may be described as having dimension and shape, in order to describe the invention, references will be made to dimensions of the pattern and its feature. In particular, the invention will be described in terms of dimensional relationships of the pattern, feature, and the solid model upon which the feature pattern is included. Accordingly, shown in the figures to follow, dimensions having "*" will denote dimension that have been affected by the practice of the invention. Furthermore, for the purpose of describing the invention, modification in dimensions may correspond to modification in the underlying 2-D sketch (i.e., a reduction in length of a geometry piece corresponds to new dimension that defines the reduced length).

Figure 3:
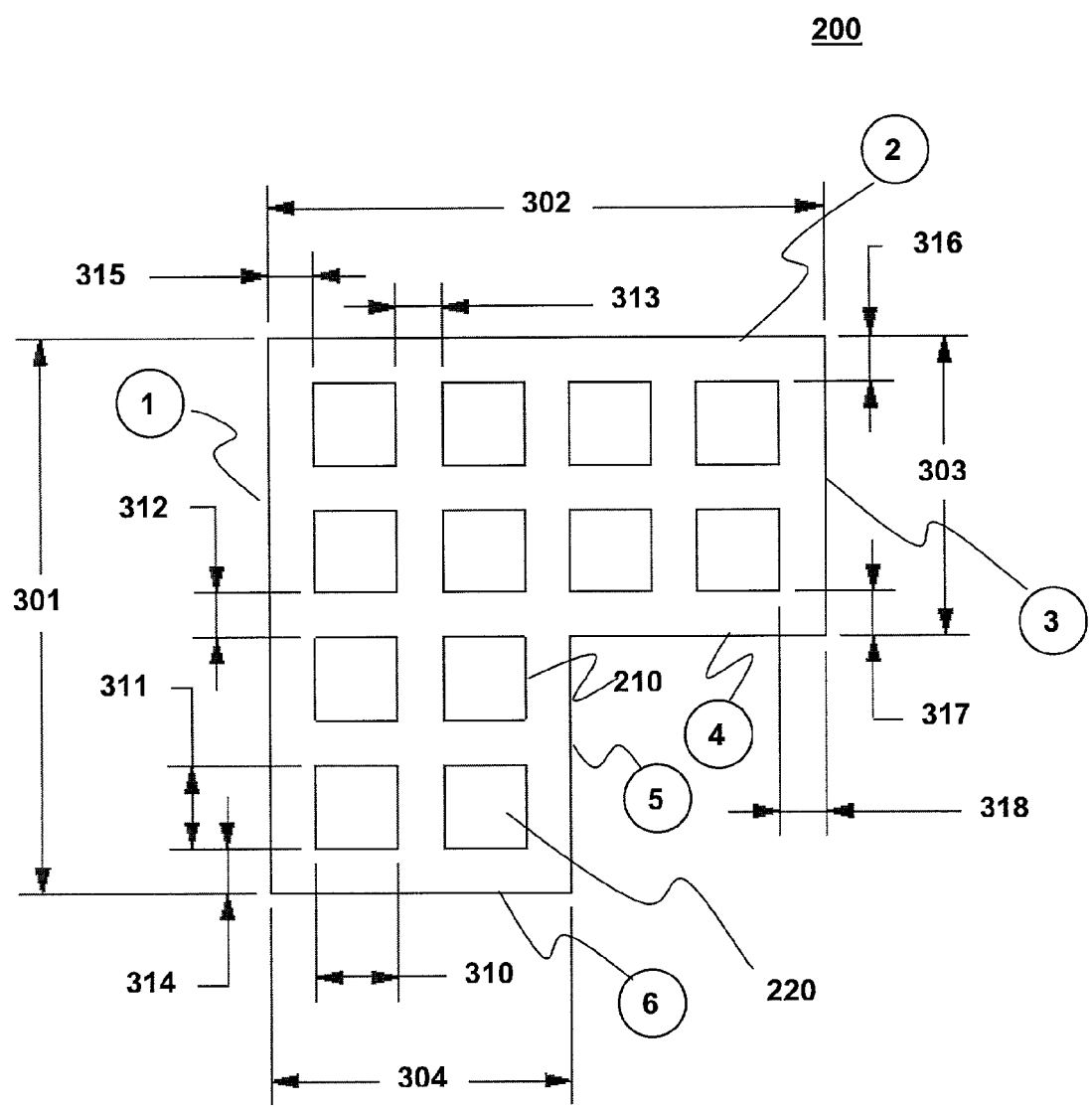
FIG. 3 illustrates a top view of a solid model having a pattern of features whereby the pattern and its feature may be described in terms of dimensions for describing an embodiment of the invention.

FIG. 3 illustrates a top view of a solid model having a pattern of features whereby the pattern and its feature may be described in terms of dimensions for describing an embodiment of the invention. Shown in FIG. 3 is a top view of the solid model 200 having the pattern 210 of feature 220 (shown in FIG. 2). Six critical sides 1-6 as shown bound the solid model 200. Critical dimension 301 defines length of side 1, critical dimension 302 defines length of side 2, critical dimension 303 defines length of side 3, and critical dimension 304 defines length of side 6. Together, critical dimensions 301-304 define the boundary of the solid model 200. Furthermore, as will be described below, the critical dimensions 301-304 may be utilized to calculate a surface area having the pattern 210.

Critical dimensions 310 & 311 also define the feature 220 that make up the pattern 210. Critical dimension 312 defines an inter-feature distance in the y-direction (Y-IFD), while critical dimension 313 defines inter-feature distance in the x-direction (X-IFD). Critical dimension 314 defines distance between the feature 220 and side 6 (boundary value 1), critical dimension 315 defines distance between the feature 220 and side 1 (boundary value 2), critical dimension 316 defines distance between the feature 220 and side 2 (boundary value 3), critical dimension 317 defines distance between feature 220 and side 3 (boundary value 4), and critical dimension 318 defines distance between feature 220 and side 4 (boundary value 5). Together, critical dimensions 310-318 define the shape of the pattern 210.

Illustrated in FIG. 3, is a top view of the solid model 200. However, as alluded to previously, it should be appreciated by those skilled in the relevant art that the illustration of solid model 200 of FIG. 3 may be an illustration of the underlying 2-D parametric sketch(s) utilized to generate the solid model 200. Accordingly, each feature 220 may also be illustrated in FIG. 3, as underlying 2-D parametric sketches utilized to generate the feature 220.

As shown in FIG. 3, in order to describe the invention, the shapes of the solid model 200 and the pattern 210 are rectangular. Furthermore, feature 220 is square in shape and instanced. However, it should be appreciated by those skilled in the relevant art that the solid model 200, the pattern 210, and the feature 220 may be of any shape, such as, but not limited to, circular or any combination of shapes.

The critical dimensions shown in FIG. 3 are exemplary to describe the invention whereby modification of the pattern 210 may be simplified, in accordance with one embodiment of the invention. Accordingly, in the description of the invention to follow, the practice of the invention may be described utilizing dimensional changes.

Figure 4:
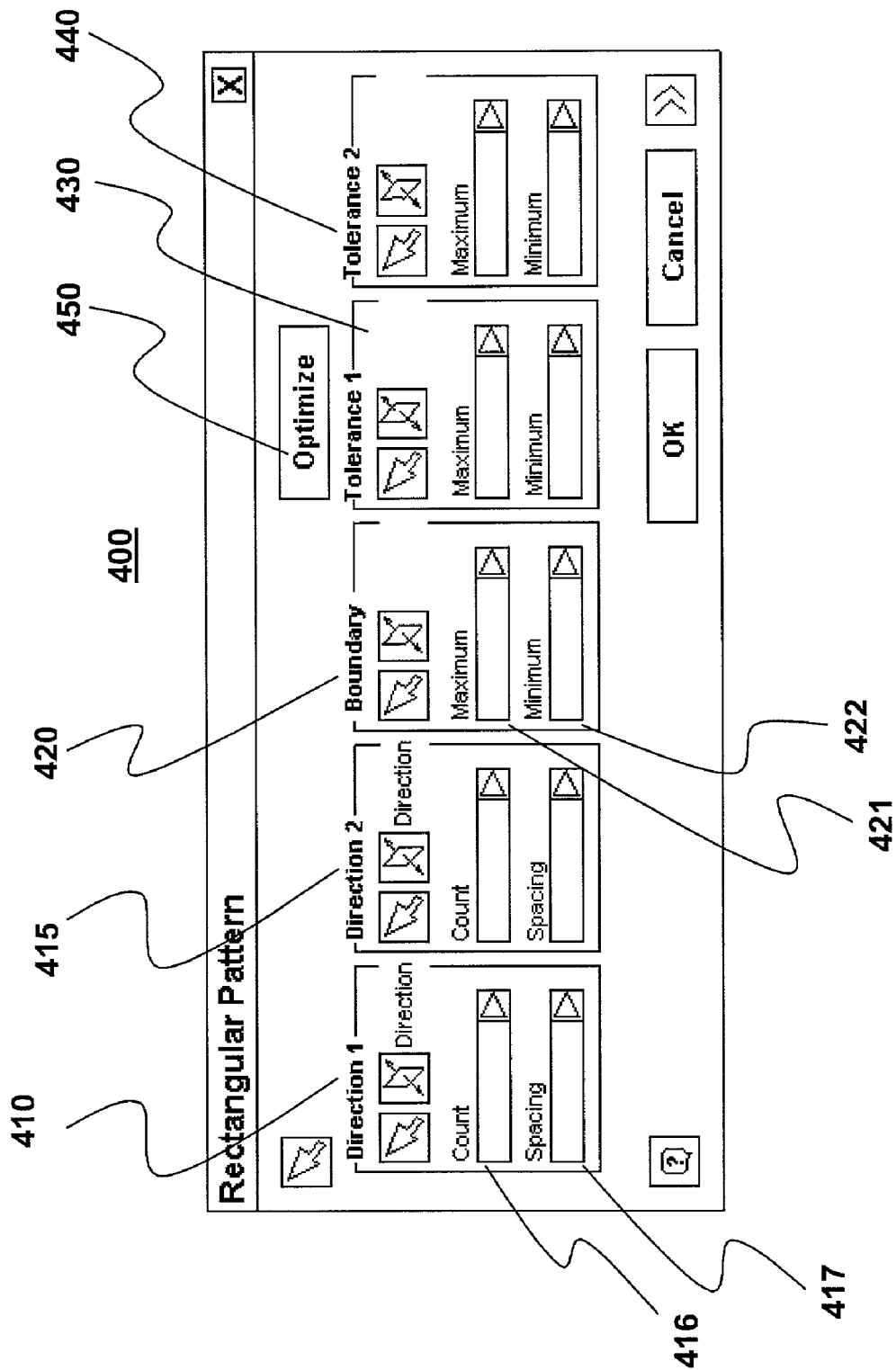
FIG. 4 illustrates an exemplary menu with which a user may enter various inputs for patterns, in accordance with one embodiment of the invention.

FIG. 4 illustrates an exemplary menu with which a user may enter various inputs for patterns, in accordance with one embodiment of the invention. Shown In FIG. 4, pattern menu 400 includes a first field for receiving an input corresponding to a first direction for the pattern to be generated, such as, but not limited to, the x-direction. The pattern menu 400 includes a second field to receive a second direction 415 for the pattern 210 to be generated, such as, but not limited to, the y-direction. Furthermore, included in the first and second fields 410 & 415 are fields/icons to receive inputs, such as count and spacing that define number of instances and the spacing between the features within the pattern 210. As will be described in further detail below, the first and second fields 410 & 415 may be utilized as the initial settings of the pattern 210. However, the first and second fields 410 & 415 may vary based at least upon the other fields/icons of the pattern menu 400, in accordance with one embodiment of the invention.

The pattern menu 400, in particular, includes a third field 420 for receiving a boundary input. The third field 420 includes fields/icons to receive inputs regarding maximum and minimum values. The boundary maximum value 421 that the user may enter corresponds to a maximum desired distance between a feature 220 and a boundary 1-6. Accordingly, the boundary minimum value 422 corresponds to a minimum desired distance between a feature 220 and a boundary 1-6.

Two additional fields, included in the pattern menu 400, are a tolerance 1 field 430 and a tolerance 2 field 440. The tolerance 1 field 430 may correspond to an inter-feature distance in the x-direction (X-IFD 313) whereby the user may enter a desired minimum and maximum distance between features in the x-direction. The tolerance 2 field 440 may correspond to an inter-feature distance in the y-direction (Y-IFD 312) whereby the user may enter a desired minimum and maximum distance between features in the y-direction.

Additionally, included in the pattern menu 400 may be a graphical representation of an optimize icon button 450, which when selected by the user, the tolerance field 1 430 and the tolerance 2 field 440 are grayed-out (i.e., non-selectable). As will be described in detail below, the tolerance field 1 430 and tolerance field 2 440 are grayed-out because if both the selection of optimize icon button 450 and a modification of the solid model 200 is received, in response, the pattern determination engine 108 automatically optimizes the pattern 210 for the solid model 200, in accordance with one embodiment of the invention.

As shown in FIG. 4, the pattern menu 400 is for a rectangular pattern. However, as alluded to earlier, it should be appreciated by those skilled in the relevant art that pattern menu 400 may be for any shape of feature, such as, but not limited to, a circular pattern. Additionally, even though maximum and minimum fields are shown, it should be appreciated that the user may enter a maximum without having to enter a minimum and vice versa.

For the purpose of describing the invention, the exemplary pattern menu 400 will be continuously referred to because as will be described in further detail, as the various inputs are received, via the user entered fields/icons, the pattern determination engine 108 simplifies modification of various aspects of the pattern 210, in accordance with various embodiments of the invention.

Figure 5:
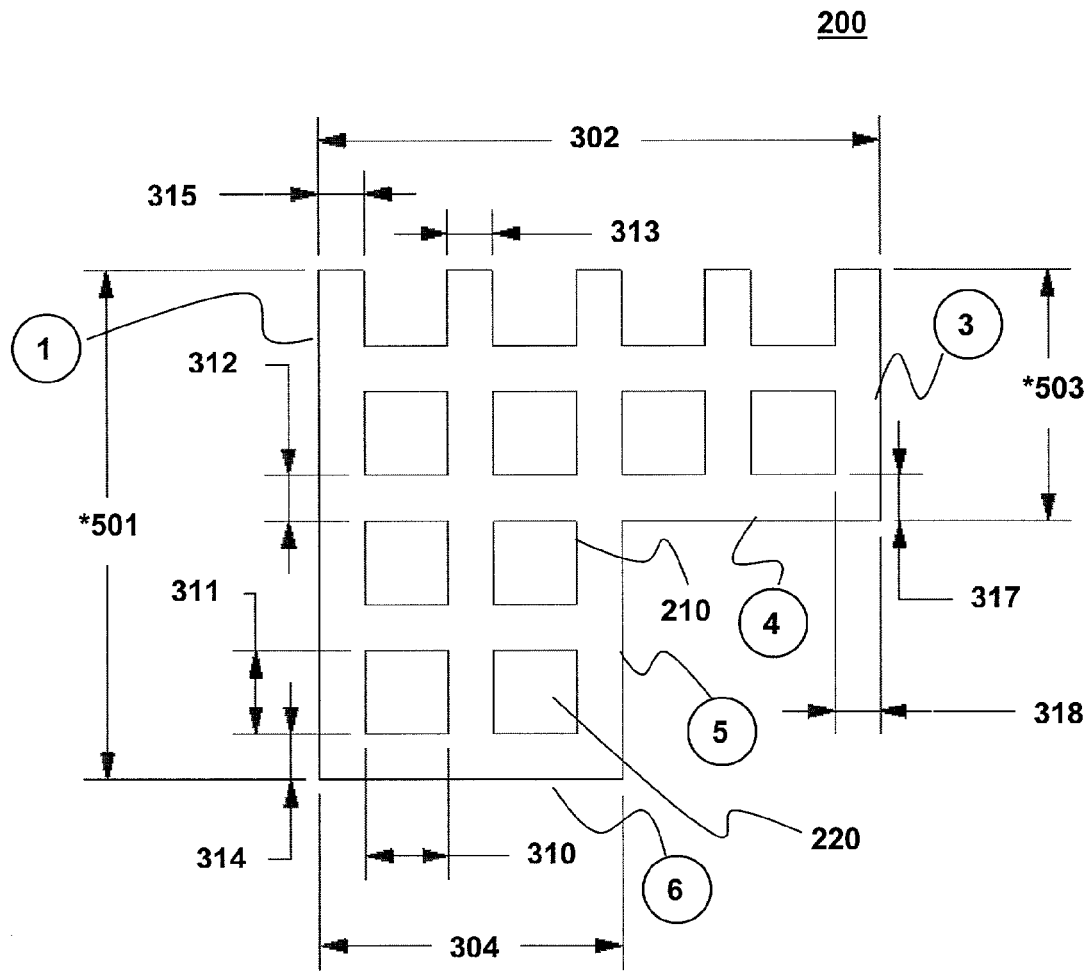
FIG. 5 illustrates a modification of a solid model and its affect on a pattern.

FIG. 5 illustrates a modification of a solid model and its affect on a pattern. Shown in FIG. 5, the length of one side 1 has been modified; in particular, the critical dimension 310 of side 1 has a new dimension *501 corresponding to the change in length of side 1. Accordingly, the critical dimension 303 of side 3 has also changed to a new dimension *503. As shown in FIG. 5, side 2 is no longer present because the initial settings of the pattern menu 400 (i.e., first and second fields 410 & 415) interfere with a new position of side 2. Furthermore, because side 2 is removed, dimension 316 is no longer present (i.e., no distance to define).

Shown in FIG. 5, before the invention is practiced, the modification to the solid model 200 will cause the undesired affect shown in FIG. 5. As alluded to earlier, because the solid model is parametric, as described previously, the modification may involve a modification to the underlying 2-D parametric sketch as well as a solid operation, such as, but not limited to, moving a face to result in the new dimension *501 for length of side 1 . . . Accordingly, the solid model shown in FIG. 5 may be an updated solid model after the user has performed the modification(s).

Figure 6:
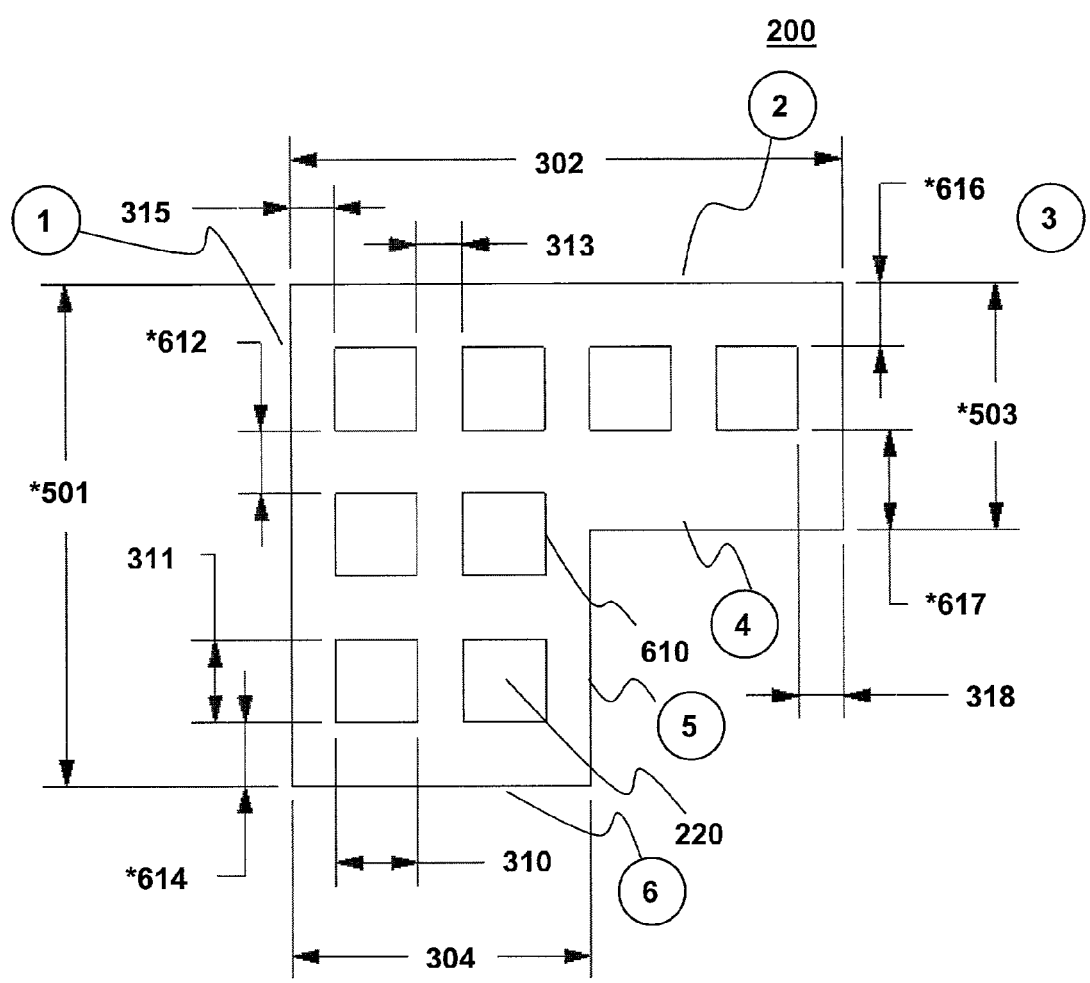
FIG. 6 illustrates simplified modification of a pattern on a solid model, in accordance with one embodiment of invention.

FIG. 6 illustrates simplified modification of a pattern on a solid model, in accordance with one embodiment of invention. Shown in FIG. 6, the pattern 210 on solid model 200 has been automatically modified, in accordance with one embodiment of the invention. As shown in FIG. 6, in response to the modification to the solid model 200, the pattern determination engine 108 retrieves various inputs entered by the user through the pattern menu 400. From the various inputs, the pattern determination engine 108 determines if the pattern 210 needs to be modified. Upon identifying the modifications that need to be made, pattern determination 108 causes other functional blocks of design engine 104 to modify the pattern 210 resulting in an automatically modified pattern 610 shown in FIG. 6.

Referring temporarily back to FIG. 4, the automatically modified pattern 610 may be caused by the user entering various inputs via certain fields/icons, such as, but not limited to, the user entering a minimum value in the boundary field 450.

Accordingly, in FIG. 6, in response to the input, the pattern determination engine 108 analyzes if any modification needs to be made to pattern 610. For example, if it is determined that a row of features need to be removed, the pattern determination engine 108 causes other functional blocks of design engine 104 to remove a row of features. For the example in which a row of features needs to be removed, the pattern determination engine 108 determines that the boundary minimum value 422 (shown in FIG. 4) is not met for critical side 2. That is, there is an interference between the critical side 2 and the feature 220 causing critical side 2 to be removed, as shown in FIG. 5. Accordingly, in FIG. 6, the pattern determination engine 108 determines that the interfering row of features needs to be removed resulting in the pattern and its features being continuously included within the boundary of the modified solid model.

Furthermore, in response to removing the row of features that does not meet the boundary minimum value 422 in the boundary field 420, the pattern determination engine 108 causes other functional blocks of design engine 104 to modify the Y-IFD 312, in order to have an automatically modified Y-IFD *612.

Shown in FIG. 6, in response to the input, pattern determination engine 108 determines that if the boundary value 1 314 (shown in FIG. 3) is to be modified to ensure that the boundary minimum value 422 in the boundary field 420 is met (both shown in FIG. 4), the boundary value 1 314 between the feature 220 and side 6 has to be modified to a new boundary value 1' *614. Additionally, in order to maintain alignment between features, the pattern determination engine 108 determines that the boundary value 4 317, between the feature 220 and side 3, has to be modified to a new boundary value 4' *617. Furthermore, because a row of features 220 has been removed, the pattern determination engine 108 determines that boundary value 3 316, between the feature 220 and side 2, needs to be modified a new boundary value 3' *616. As alluded to previously, the pattern determination engine 108 may determine the necessary modifications, the Y-IFD *612, new boundary value 1' *614, new boundary value 3' *616, and new boundary value 4' *617, of the automatically modified pattern 610 based at least upon the inputs of pattern menu 400 (shown in FIG. 4).

Upon determining these necessary modifications, pattern determination engine 108 causes other functional blocks of design engine 104 to effectuate the changes to the solid model reflecting the necessary modification to the critical dimensions.

In the one embodiment, the pattern determination engine 108 determined that Y-IFD dimension *612, new boundary value 1' *614, between the feature 220 and side 6, and new boundary value 3' *616 between the feature 220 and side 2 need to be modified to maintain their equivalency. In another embodiment, pattern determination engine 108 also automatically determines Y-IFD *612, new boundary value 1' *614, and new boundary value 3' *616 may be different based at least upon the user entering various inputs via certain fields/icons of pattern menu 400. Depending on the results of these analyses, pattern determination engine 108 invokes other functional blocks to modify the solid model to reflect the necessary changes, if any.

As a result, a pattern is automatically updated in response to modifications in a solid model.

In summary, in response to the user inputs, pattern determination engine 108 evaluates the various critical dimensions to determine whether any modification is necessary to conform to the inputs provided by the user. Upon determining one or more necessary modifications to the critical dimensions, pattern determination engine 108 further evaluates the impact of the necessary modifications, to determine if complementary modifications to each of the other critical dimensions are necessary to maintain consistency and/or equivalency. Pattern determination engine 108 iteratively repeats this process until the analysis converges, and it is determined that all critical dimensions settle to a set of new consistent mutually conforming values.

Figure 7:
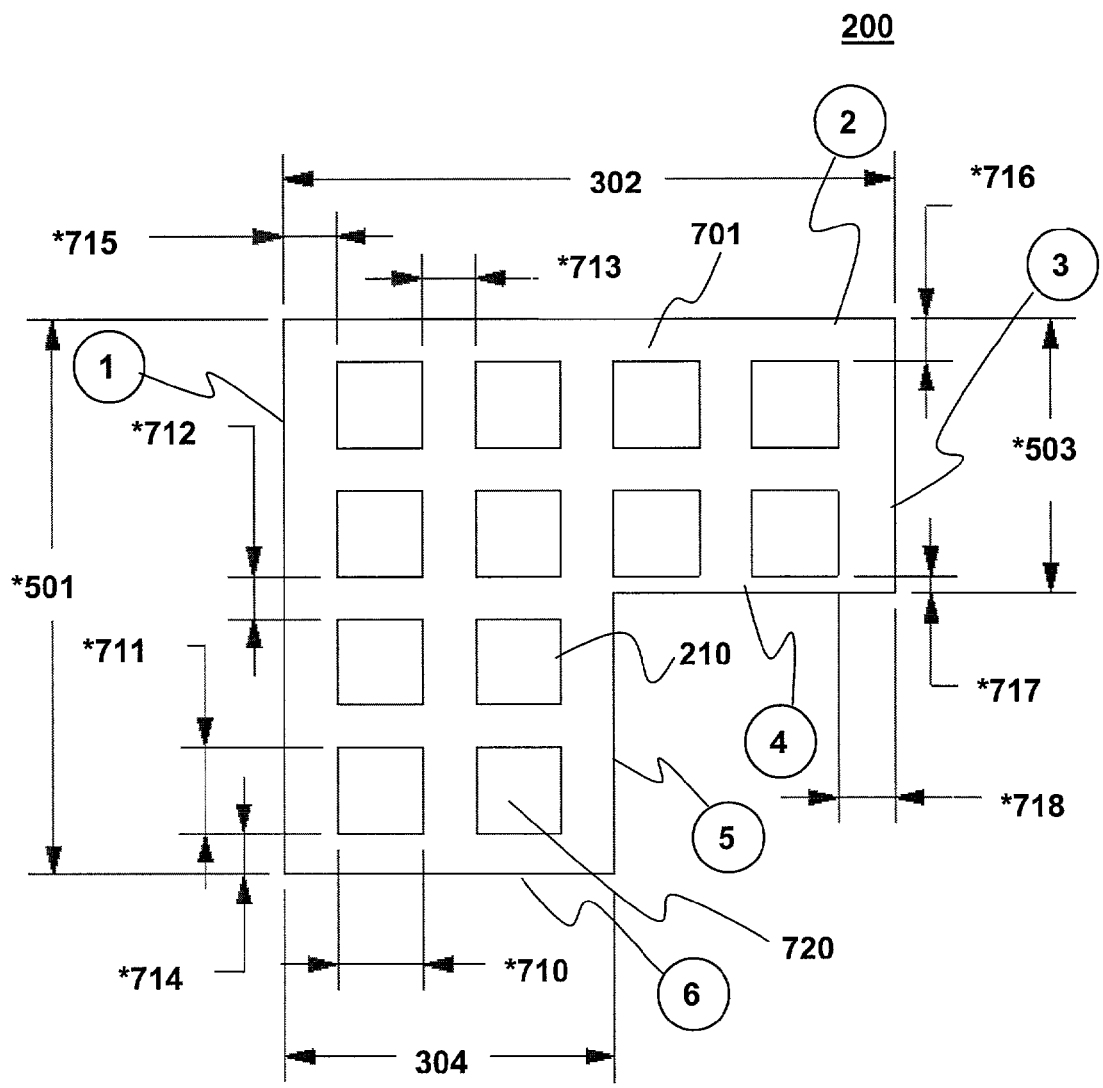
FIG. 7 illustrates simplified modification of a pattern on a solid model, where the pattern is optimized, in accordance with another embodiment of invention.

FIG. 7 illustrates simplified modification of a pattern on a solid model, where the pattern is optimized, in accordance with another embodiment of invention. Shown in FIG. 7, the solid model 200 continues to have the solid model modified dimensions of *501 & *503. However, the resulting pattern shown in FIG. 7, is in response to receiving a user selection of optimize 450 via pattern menu 400 (shown in FIG. 4). From the various inputs and the optimize input 450, the pattern determination engine 108 determines a ratio between the surface area of the solid model, within which the pattern is included, and the total surface area that the features occupy (i.e., surface area of each feature multiplied by the number of features). Upon determining the ratio, the pattern determination engine 108 determines if the pattern 210 needs to be modified. Based at least upon the various inputs and the determined ratio, the pattern determination engine 108 identifies the modifications that need to be made to the pattern 210, in order to maintain the ratio. Upon identifying the modifications that need to be made, the pattern determination engine 108 causes other functional blocks of design engine 104 to modify the size of the feature 220, while maintaining the shape of the pattern 210.

As shown in FIG. 7, the modified dimensions *501 & *503 changes a surface area 701, having the pattern 210, and in response to the changes, the pattern determination engine 108 analyzes if any modification needs to be made to pattern 210, in particular, to features 220 (shown in FIG. 2) of the pattern 210. For example, if it is determined that the features 210 need to be modified, the pattern determination engine 108 causes other functional blocks of design engine 104 to modify the size of the feature 220 resulting in a new feature 720 having new feature dimensions *710 & *711, as shown in FIG. 7. Furthermore, as shown in FIG. 7, in response to new features 720 having new feature dimensions *710 & *711, pattern determination engine 108 determines if other related dimensions, such as the critical dimensions 312-318 (shown in FIG. 3) also need to be modified. Upon determining that other related dimensions, such as critical dimensions 312-318 (shown in FIG. 3) need to be modified, pattern determination engine 108 causes other functional blocks of design engine 104 to modify critical dimensions 312-318, that define the pattern 210, to new dimensions *712-*718, as shown in FIG. 7.

As a result, simplified modification of patterns in a three-dimensional (3-D) solid geometry piece is facilitated, where the patterns are optimized.

Figure 8:
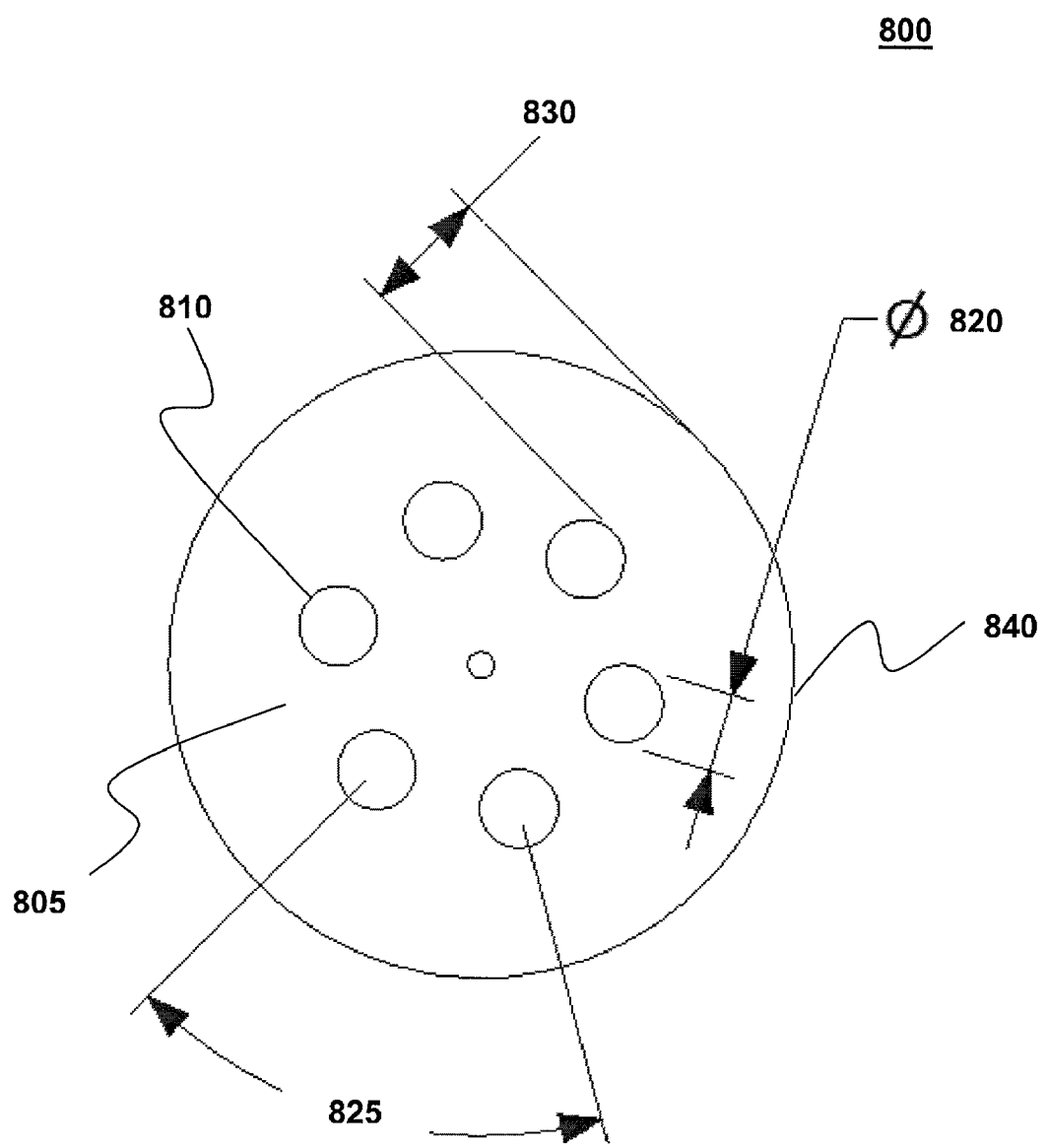
FIG. 8 illustrates an example of an alternative shape of a solid model with which an embodiment of the invention may be practiced.

FIG. 8 illustrates an example of an alternative shape of a solid model with which an embodiment of the invention may be practiced. As alluded to earlier, the shape of a solid model may differ from the rectangular shape as previously described, and accordingly, a pattern of features may differ based at least upon the shape of the solid model. Illustrated in FIG. 8, is a top view of a solid model having a circular shape 800. A number features of a circular shape 810 forms a substantially circular pattern 805, as illustrated. Each of the features of circular shape 810 may be defined by a diameter 820. Position of each of the features of circular shape 810 may be defined by an angle 825. Additionally, a radial distance 830 may define a distance from the features of circular shape 810 and a boundary 840 of the solid model having the circular shape 800.

In FIG. 8, if the solid model having the circular shape 800 is modified, such as, but not limited to, the boundary 840 being enlarged. In response, based at least upon the various inputs of pattern menu 400 (shown in FIG. 4), the pattern determination engine 108 determines what modification, if any, needs to be made in view of the modifications being made to the solid model, as earlier described (i.e., by analyzing various critical dimensions). As previously described, upon identifying the modifications that need to be made, pattern determination engine 108 causes other functional blocks of design engine 104 to effectuate the desired changes, such as to modify the circular pattern 805 and/or the features of circular shape 810 based at least upon the inputs entered by the user through the pattern menu 400 and by analyzing various critical dimensions. For example, in FIG. 8, the modification may be a change in diameter 820, a change in the number of features of circular shape 810, and so forth.

As a result, the teachings of the invention are not limited to simple shapes such as squares or rectangles, but apply to radial as well.

Figure 9:
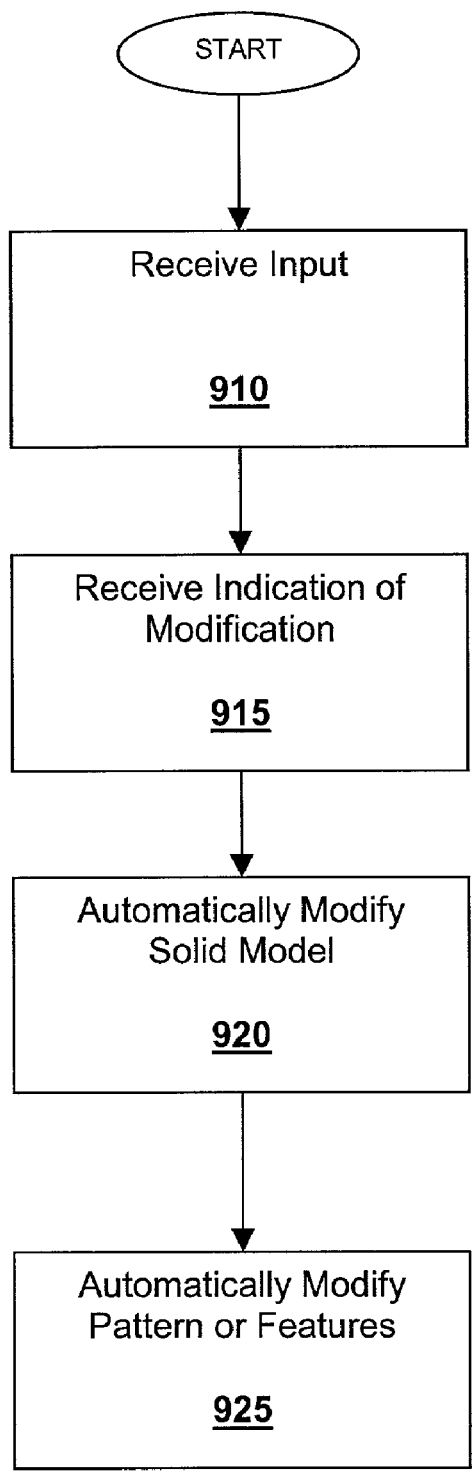
FIG. 9 illustrates operational flow for simplified modification of patterns of features in a solid model, in accordance with one embodiment of the invention.

FIG. 9 illustrates operational flow for simplified modification of patterns of features in a solid model, in accordance with one embodiment of the invention. For the illustrated embodiment, pattern determination engine 108 (shown in FIG. 1) is programmed in an event driven model (i.e., pattern determination engine 108 is designed to be executed in a system environment where various event notification services are available from the operating system). One example of such an operating system suitable for practicing the invention is the Windows® operating system, available from Microsoft Corporation of Redmond, Wash. In alternate embodiments, pattern determination engine 108 may be implemented in other programming approaches known in the art.

At operational block 910, the pattern determination engine 108 receives an input corresponding to generation of a pattern in a computer aided design (CAD) geometry piece. The pattern comprises of a number of features included within a boundary of the CAD geometry piece. As described previously, the input may be through a pattern menu.

At operational block 915, the pattern determination engine receives an indication of modification to the CAD geometry piece. In response, the pattern determination engine 108 causes other functional blocks of design engine 104 to automatically modify the CAD geometry piece and its boundary based at least upon the received indication, at operational block 920.

Additionally, in response to the modification of the CAD geometry piece, the pattern determination engine 108 determines what modification, if any, needs to be made in view of the modifications being made to the solid model, as earlier described (i.e., by analyzing the various critical dimensions). Upon so determining, pattern determination engine 108 causes other functional blocks of design engine 104 to effectuate the desired changes to the pattern and the number of features to be continuously included within the boundary of the modified CAD geometry piece, at operational block 925. The features or the pattern is modified based at least upon the modified CAD geometry piece and the received input.

As a result, simplified modification of patterns of features in a solid model is facilitated.

Figure 10:
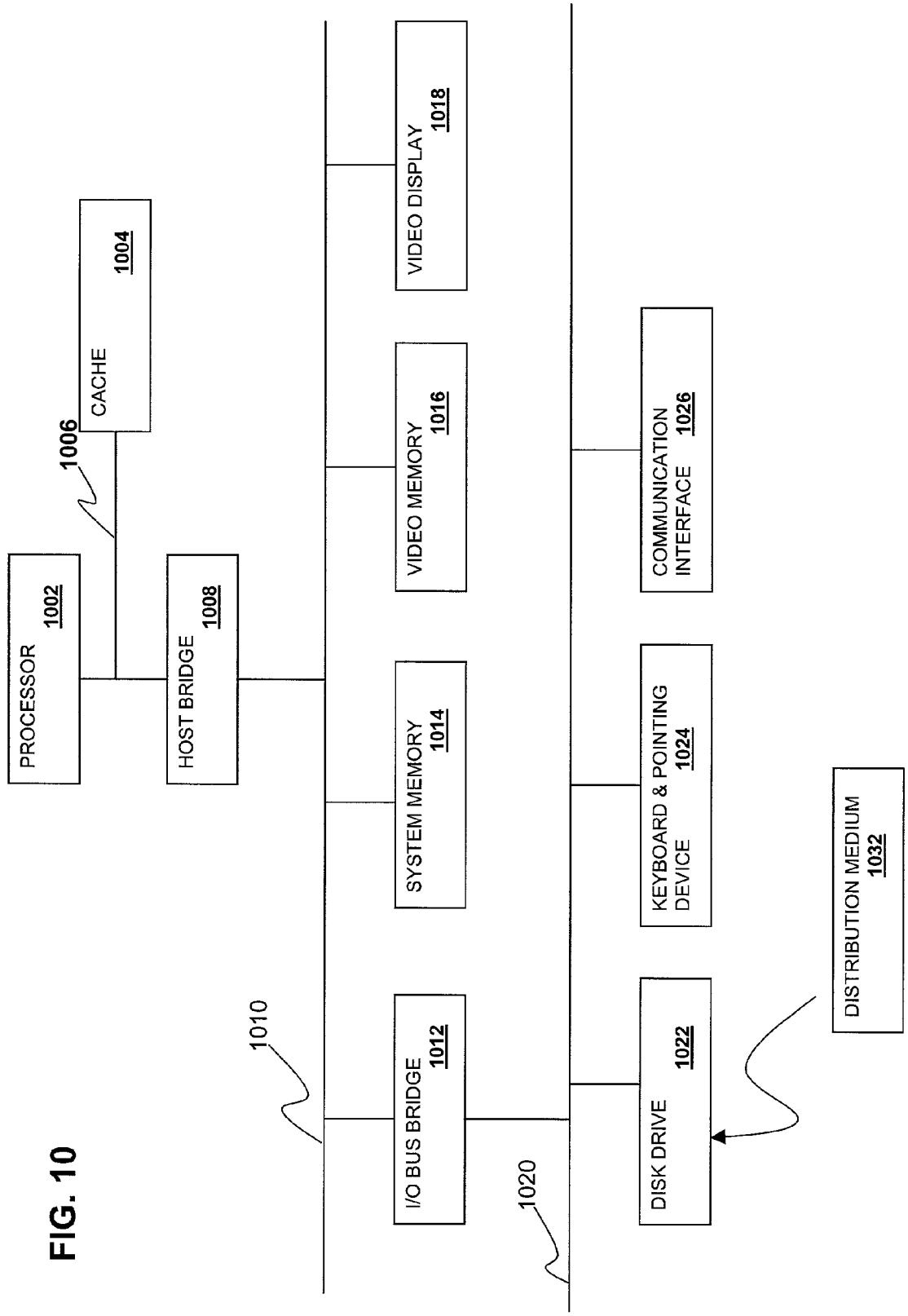
FIG. 10 illustrates one embodiment of a computer system suitable to be programmed with the mechanical design application of the invention.

FIG. 10 illustrates one embodiment of a computer system suitable to be programmed with the mechanical design application of the invention. As shown, for the illustrated embodiment, computer 1000 includes processor 1002, processor bus 1006, high performance I/O bus 1010 and standard I/O bus 1020. Processor bus 1006, and high performance I/O bus 1010 are bridged by host bridge 1008, whereas I/O buses 1010 and 1020 are bridged by I/O bus bridge 1012. Coupled to processor bus 1006 is cache 1004. Coupled to high performance I/O bus 1010 are system memory 1014 and video memory 1016, against which video display 1018 is coupled. Coupled to standard I/O bus 1020 are disk drive 1022, keyboard and pointing device 1024, and communication interface 1026.

These elements perform their conventional functions known in the art. In particular, disk drive 1022 and system memory 1014 are used to store permanent and working copies of the mechanical design system incorporated with the teachings of the invention. The permanent copy may be pre-loaded into disk drive 1022 in factory, loaded from distribution medium 1032, or down loaded from a remote distribution source (not shown). Distribution medium 1032 may be a tape, a CD, and DVD or other storage medium of the like. The constitutions of these elements are known. Any one of number implementations of these elements known in the art may be used to form computer system 1000.

In general, those skilled in the art will recognize that the invention is not limited by the details described, instead, the invention can be practiced with modifications and alterations within the spirit and scope of the appended claims. The description is thus to be regarded as illustrative instead of restrictive on the invention.

Thus, an improved way of modifying patterns of features in solid models is disclosed.

What is claimed is:

1. A method comprising:

receiving a user-specified input defining a feature for a pattern and a minimum boundary-to-feature distance, the features of the plurality being evenly spaced relative to each other, the features of the plurality included within a boundary of a CAD geometry piece, and where a feature corresponds to a feature of the CAD geometry piece;

receiving an indication of modification to the boundary of the CAD geometry piece;

modifying the boundary of the CAD geometry piece based at least upon the received indication; and maintaining continuous enclosure of the pattern within the modified boundary of the modified CAD geometry piece, including modifying at least one of the pattern or the plurality of features to be continuously enclosed within the modified boundary of the CAD geometry piece, based at least upon the modified boundary of the CAD geometry piece and the received input, wherein the maintaining continuous enclosure of the pattern is performed by a computer processor and comprises:

determining that including the plurality of features within the modified boundary violates the minimum boundary-to-feature distance, and in response to the determining, removing features from the pattern so that the minimum boundary-to-feature distance is satisfied with the remaining features included within the modified boundary.

2. The method of claim 1, wherein said receiving the input comprises receiving an input corresponding to an indication of a direction, the indication having an X-component and a Y-component.

3. The method of claim 1, wherein:

said receiving the input includes receiving a boundary value, the boundary value having at least one of a maximum value and a minimum value defining a maximum and a minimum, respectively, for a distance between at least one feature and the boundary; and modifying at least one of the pattern or the plurality of features includes maintaining a distance between the at least one feature and the boundary within the boundary value.

4. The method of claim 1, wherein said receiving the indication of modification comprises receiving an indication of modification to a 2-D geometry piece parametrically defining the CAD geometry piece.

5. The method of claim 4, wherein said receiving the modification to the geometry comprises receiving an indication of modification of a dimension of the 2-D geometry piece parametrically defining said CAD geometry piece.

6. The method of claim 1, wherein said receiving the input comprises receiving an indication to optimize the pattern.

7. The method of claim 1, wherein said modifying the CAD geometry piece comprises parametrically updating the CAD geometry piece.

8. The method of claim 1, wherein said modifying at least one of the pattern or the plurality of features comprises determining what modification, if any, is necessary to one or more dimensions of at least one of the plurality of features.

9. The method of claim 1, wherein said modifying at least one of the pattern or the plurality of features comprises determining what modification, if any, is necessary to an inter-feature distance between each of the plurality of features, and changing the inter-feature distance between at least one feature and an adjacent feature upon determining the modification is necessary.

10. The method of claim 1, wherein said modifying at least one of the pattern or the plurality of features comprises:
determining what modification, if any, is necessary to a first dimension in view of a determined modification to a second dimension, to maintain a relationship between said first and second dimensions, where the first dimension and the second dimension comprise first and second dimensions of each feature of the plurality of features, and
modifying at least one of the first dimension or the second dimension of each feature of the plurality of features.

11. The method of claim 1, wherein said modifying at least one of the pattern or the plurality of features includes adjusting a distance between at least one feature and the boundary such that the plurality of features are continuously enclosed within the boundary.

12. The method of claim 1, further comprising:
receiving a user-specified input defining a minimum inter-feature distance; and
in response to the determining, modifying a spacing between features of the pattern so that the remaining features included within the modified boundary satisfy the minimum boundary-to-feature distance and the minimum inter-feature distance.

13. An apparatus comprising:
a processor to execute programming instructions; and
a storage medium having stored therein a plurality of programming instructions, which when executed by the processor perform operations comprising:
receiving a user-specified input defining a feature for a pattern and a minimum boundary-to-feature distance, the features of the plurality being evenly spaced relative to each other, the features of the plurality included within a boundary of a CAD geometry piece, and where a feature corresponds to a feature of the CAD geometry piece;
receiving an indication of modification to the boundary of the CAD geometry piece;
modifying the boundary of the CAD geometry piece based at least upon the received indication; and
maintaining continuous enclosure of the pattern within the modified boundary of the modified CAD geometry piece, including instructions, which when executed, cause the apparatus to modify at least one of the pattern or the plurality of features to be continuously enclosed within the modified boundary of the CAD geometry piece, based at least upon the modified boundary of the CAD geometry piece and the received input, wherein the maintaining continuous enclosure of the pattern comprises:
determining that including the plurality of features within the modified boundary violates the minimum boundary-to-feature distance, and
in response to the determining, removing features from the pattern so that the remaining features included within the modified boundary satisfy the minimum boundary-to-feature distance.

14. The apparatus of claim 13, wherein said programming instructions, which when executed, cause the apparatus to receive an input corresponding to an indication of a direction, the indication having an X-component and a Y-component.

15. The apparatus of claim 13, wherein said programming instructions, which when executed, cause the apparatus to:
receive a boundary value, the boundary value having at least one of a maximum value and a minimum value defining a maximum and a minimum, respectively, for a distance between at least one feature and the boundary, and
maintain a distance between the at least one feature and the boundary within the boundary value.

16. The apparatus of claim 15, wherein said programming instructions, which when executed, cause the apparatus to receive an indication of modification of a dimension of the 2-D geometry piece parametrically defining said CAD geometry piece.

17. The apparatus of claim 13, wherein said programming instructions, which when executed, cause the apparatus to receive an indication to optimize the pattern.

18. The apparatus of claim 13, wherein said programming instructions, which when executed, cause the apparatus to parametrically update the CAD geometry piece.

19. The apparatus of claim 13, wherein said programming instructions, which when executed, cause the apparatus to determining what modification, if any, is necessary for various dimensional sizes of each of the plurality of features.

20. The apparatus of claim 13, wherein said programming instructions, which when executed, cause the apparatus to determine what modification, if any, is necessary to an inter-feature distance between each of the plurality of features, and changing the inter-feature distance between at least one feature and an adjacent feature upon determining the modification is necessary.

21. The apparatus of claim 13, wherein said programming instructions, which when executed, cause the apparatus to determine what modification, if any, is necessary to a dimension to conform to a user specified input.

22. The apparatus of claim 13, wherein said programming instructions, which when executed, cause the apparatus to determine what modification, if any, is necessary to a first dimension in view of a determined modification to a second dimension, to maintain a relationship between said first and second dimensions, where the first dimension and the second dimension comprise first and second dimensions of each feature of the plurality of features, and modifying at least one of the first dimension or the second dimension of each feature of the plurality of features.

23. The apparatus of claim 13, wherein said programming instructions, which when executed, cause the apparatus to modify at least one of the pattern or the plurality of features include programming instructions, which when executed, cause the apparatus to remove one or more features from the pattern.

24. The apparatus of claim 13, wherein said programming instructions, which when executed, cause the apparatus to modify at least one of the pattern or the plurality of features include programming instructions, which when executed, cause the apparatus to adjust a distance between at least one feature and the boundary such that the plurality of features are continuously enclosed within the boundary.

25. An article of manufacture having stored therein plurality of programming instructions, which when executed, the instructions cause a computer processor to:

receive a user-specified input defining a feature for a pattern and a minimum boundary-to-feature distance, the features of the plurality being evenly spaced relative to each other, the features of the plurality included within a boundary of a CAD geometry piece, and where a feature corresponds to a feature of the CAD geometry piece;

receive an indication of modification to a boundary of the CAD geometry piece;

modify the boundary of the CAD geometry piece based at least upon the received indication; and maintain continuous enclosure of the pattern within the modified boundary of the modified CAD geometry piece, including modifying at least one of the pattern or the plurality of features to be continuously enclosed within the modified boundary of the CAD geometry piece, based at least upon the modified boundary of the CAD geometry piece and the received input, wherein the maintaining continuous enclosure of the pattern comprises:

determining that including the plurality of features within the modified boundary violates the minimum boundary-to-feature distance, and in response to the determining, removing features from the pattern so that the remaining features included within the modified boundary satisfy the minimum boundary-to-feature distance.

26. The article of manufacture of claim 25, wherein said programming instructions, which when executed, cause the machine to receive an input corresponding to an indication of a direction, the indication having an X-component and a Y-component.

27. The article of manufacture of claim 25, wherein said programming instructions, which when executed, cause the machine to:

receive a boundary value, the boundary value having at least one of a maximum value and a minimum value defining a maximum and a minimum, respectively, for a distance between at least one feature and the boundary, and maintain a distance between the at least one feature and the boundary within the boundary value.

28. The article of manufacture of claim 25, wherein said programming instructions, which when executed, cause the machine to receive an indication of modification to a 2-D geometry piece parametrically defining the CAD geometry piece.

29. The article of manufacture of claim 25, wherein said programming instructions, which when executed, cause the machine to receive an indication of modification of a dimension of the 2-D geometry piece parametrically defining said CAD geometry piece.

30. The article of manufacture of claim 25, wherein said programming instructions, which when executed, cause the machine to receive an indication to optimize the pattern.

31. The article of manufacture of claim 25, wherein said programming instructions, which when executed, cause the machine to parametrically update the CAD geometry piece.

32. The article of manufacture of claim 25, wherein said programming instructions, which when executed, cause the machine to determine what modification, if any, is necessary for various dimensional sizes of each of the plurality of features.

33. The article of manufacture of claim 25, wherein said programming instructions, which when executed, cause the machine to determine what modification, if any, is necessary to an inter-feature distance between each of the plurality of features, and changing the inter-feature distance between at least one feature and an adjacent feature upon determining the modification is necessary.

34. The article of manufacture of claim 25, wherein said programming instructions, which when executed, cause the machine to determine what modification, if any, is necessary to a dimension to conform to a user specified input.

35. The article of manufacture of claim 25, wherein said programming instructions, which when executed, cause the machine to:

determine what modification, if any, is necessary to a first dimension in view of a determined modification to a second dimension, to maintain a relationship between said first and second dimensions, where the first dimension and the second dimension comprise first and second dimensions of each feature of the plurality of features, and modify at least one of the first dimension or the second dimension of each feature of the plurality of features.

36. The article of manufacture of claim 25, wherein said programming instructions, which when executed, cause the machine to modify at least one of the pattern or the plurality of features include programming instructions, which when executed, cause the machine to remove one or more features from the pattern.

37. The article of manufacture of claim 25, wherein said programming instructions, which when executed, cause the machine to modify at least one of the pattern or the plurality of features include programming instructions, which when executed, cause the machine to adjust a distance between at least one feature and the boundary such that the plurality of features are continuously enclosed within the boundary.

38. A method comprising:

receiving a user-specified input defining a feature for a pattern and at least one inter-feature distance, the pattern defined from the feature and comprising a plurality of the feature, the inter-feature distance specifying a minimum or a maximum distance between the features of the pattern, the features of the plurality being evenly spaced relative to each other, the features of the plurality included within a boundary of a CAD geometry piece, and where a feature corresponds to a feature of the CAD geometry piece;

receiving an indication of modification to the CAD geometry piece;

automatically modifying the CAD geometry piece and its boundary based at least upon the received indication; and automatically maintaining continuous enclosure of the pattern within the modified boundary of the modified CAD geometry piece, including automatically modifying at least one of the pattern or the plurality of features to be continuously enclosed within the boundary of the modified CAD geometry piece, based at least upon the modified CAD geometry piece and the received input, wherein said automatically modifying at least one of the pattern or the plurality of features includes removing one or more features from the pattern.

* * * * *

UNITED STATES PATENT AND TRADEMARK OFFICE
CERTIFICATE OF CORRECTION

PATENT NO. : 7,643,968 B1 Page 1 of 1
APPLICATION NO. : 10/085528
DATED : January 5, 2010
INVENTOR(S) : Mark W. Lambert et al.

It is certified that error appears in the above-identified patent and that said Letters Patent is hereby corrected as shown below:

In column 12, line 49, in claim 19, delete "determining" and insert -- determine --, therefor.

Signed and Sealed this

Sixth Day of April, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,643,968 B1 |
| APPLICATION NO. | : 10/085528 |
| DATED | : January 5, 2010 |
| INVENTOR(S) | : Lambert et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1225 days.

Signed and Sealed this

Sixteenth Day of November, 2010

David J. Kappos
*Director of the United States Patent and Trademark Office*